(12) United States Patent
Ramaswamy (10) Patent No.: US 10,615,114 B2
(45) Date of Patent: *Apr. 7, 2020

(54) ARRAYS OF MEMORY CELLS INDIVIDUALLY COMPRISING A CAPACITOR AND A TRANSISTOR AND METHODS OF FORMING SUCH ARRAYS

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/269,687

(22) Filed: Feb. 7, 2019

(65) Prior Publication Data

US 2019/0295941 A1 Sep. 26, 2019

Related U.S. Application Data

(63) Continuation of application No. 15/928,956, filed on Mar. 22, 2018, now Pat. No. 10,229,874.

(51) Int. Cl.
*H01L 23/52* (2006.01)
*H01L 23/522* (2006.01)
*G11C 5/02* (2006.01)
*G11C 5/10* (2006.01)

(52) U.S. Cl.
CPC ............ *H01L 23/5225* (2013.01); *G11C 5/02* (2013.01); *G11C 5/10* (2013.01); *G11C 5/025* (2013.01)

(58) Field of Classification Search
CPC ............................ H01L 23/5225; G11C 5/02
See application file for complete search history.

(56) References Cited

U.S. PATENT DOCUMENTS

| | | | |
|---|---|---|---|
| 4,901,285 A | 2/1990 | Sano et al. | |
| 8,184,471 B2 | 5/2012 | Kavanagh et al. | |
| 9,570,510 B2 | 2/2017 | Kim et al. | |
| 9,941,209 B2 | 4/2018 | Tessariol et al. | |
| 10,229,874 B1* | 3/2019 | Ramaswamy | G11C 5/02 |
| 2007/0058468 A1 | 3/2007 | Butler | |
| 2009/0166701 A1 | 7/2009 | Doyle et al. | |
| 2012/0153371 A1 | 6/2012 | Chen et al. | |
| 2017/0294383 A1 | 10/2017 | Tanzawa | |
| 2018/0061835 A1 | 3/2018 | Yang et al. | |

FOREIGN PATENT DOCUMENTS

WO PCT/US2019/020206 SR 6/2019
WO PCT/US2019/020206 WO 6/2019

* cited by examiner

*Primary Examiner* — William Coleman
(74) *Attorney, Agent, or Firm* — Wells St. John P.S.

(57) ABSTRACT

An array of memory cells individually comprising a capacitor and a transistor comprises, in a first level, alternating columns of digitlines and conductive shield lines. In a second level above the first level there are rows of transistor wordlines. In a third level above the second level there are rows and columns of capacitors. In a fourth level above the third level there are rows of transistor wordlines. In a fifth level above the fourth level there are alternating columns of digitlines and conductive shield lines. Other embodiments and aspects are disclosed, including method.

23 Claims, 7 Drawing Sheets

ARRAYS OF MEMORY CELLS INDIVIDUALLY COMPRISING A CAPACITOR AND A TRANSISTOR AND METHODS OF FORMING SUCH ARRAYS

RELATED PATENT DATA

This patent resulted from a continuation application of U.S. patent application Ser. No. 15/928,956, filed Mar. 22, 2018, entitled "Arrays Of Memory Cells Individually Comprising A Capacitor And A Transistor And Methods Of Forming Such Arrays", naming Durai Vishak Nirmal Ramaswamy as inventor, the disclosure of which is incorporated by reference.

TECHNICAL FIELD

Embodiments disclosed herein pertain to arrays of memory cells individually comprising a capacitor and a transistor.

BACKGROUND

Memory is one type of integrated circuitry, and is used in computer systems for storing data. Memory may be fabricated in one or more arrays of individual memory cells. Memory cells may be written to, or read from, using digitlines (which may also be referred to as bit lines, data lines, sense lines, or data/sense lines) and wordlines (which may also be referred to as access lines). The digitlines may conductively interconnect memory cells along columns of the array, and the wordlines may conductively interconnect memory cells along rows of the array. Each memory cell may be uniquely addressed through the combination of a digitline and a wordline.

A continuing goal in fabrication of memory circuitry is to make ever-smaller and closer-spaced components of memory cells. Unfortunately, undesired parasitic capacitance occurs and increases the closer conductors are placed next to one another and can adversely impact design and operation of memory circuitry.

DETAILED DESCRIPTION OF EXAMPLE EMBODIMENTS

Figure 1:
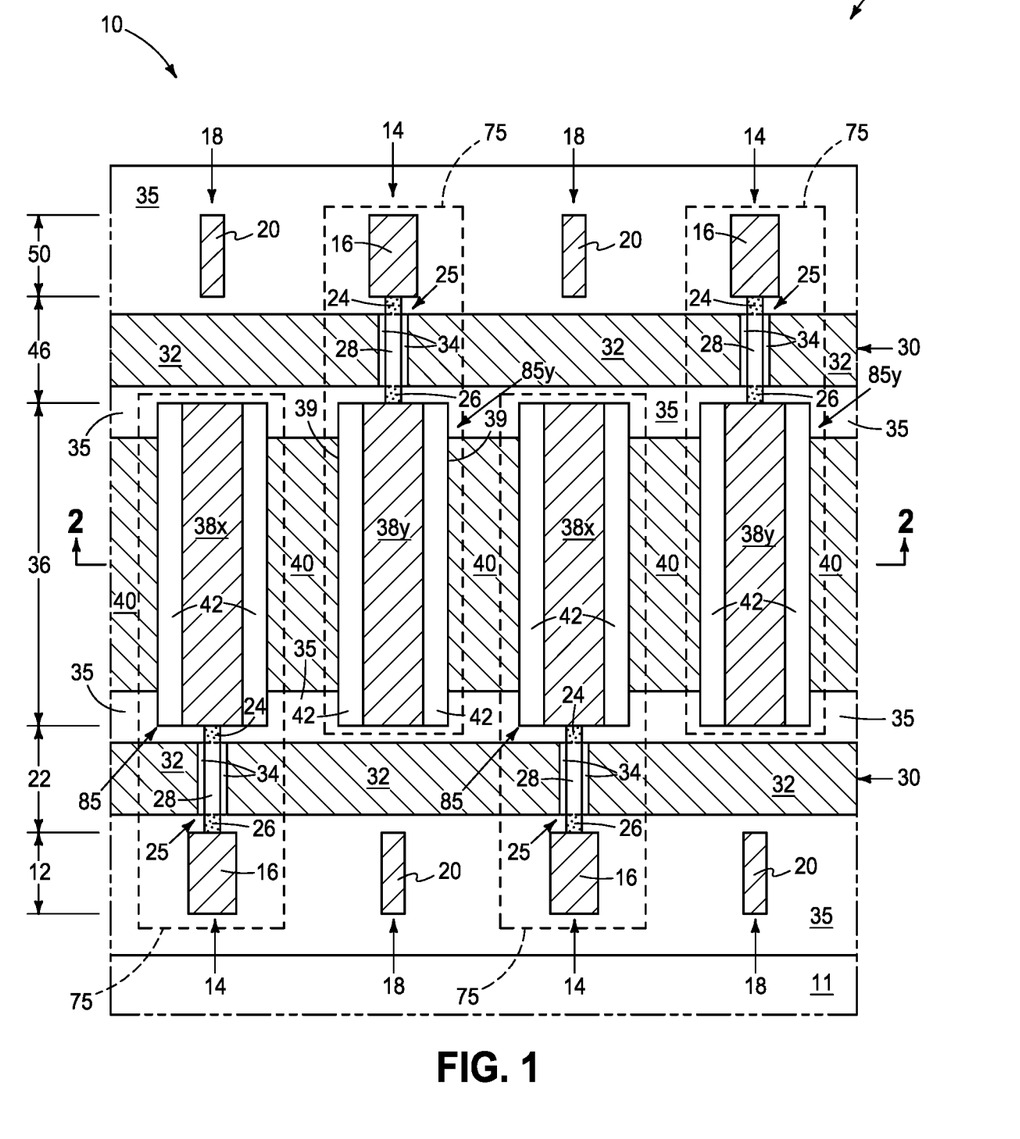
FIG. 1 is a diagrammatic cross-sectional view of a substrate construction in accordance with an embodiment of the invention, and is taken through line 1-1 in FIG. 2.

Embodiments of the invention include arrays of memory cells individually comprising a capacitor and a transistor, and methods of forming such arrays. Example embodiments are initially described with reference to FIGS. 1-3 which show an example fragment of a substrate construction 8 comprising an array or array area 10 that has been fabricated relative to a base substrate 11 (FIG. 1). Substrate 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. For better clarity of certain operative components, FIG. 3 does not show base substrate 11 and does not show surrounding dielectric isolating material.

Figure 2:
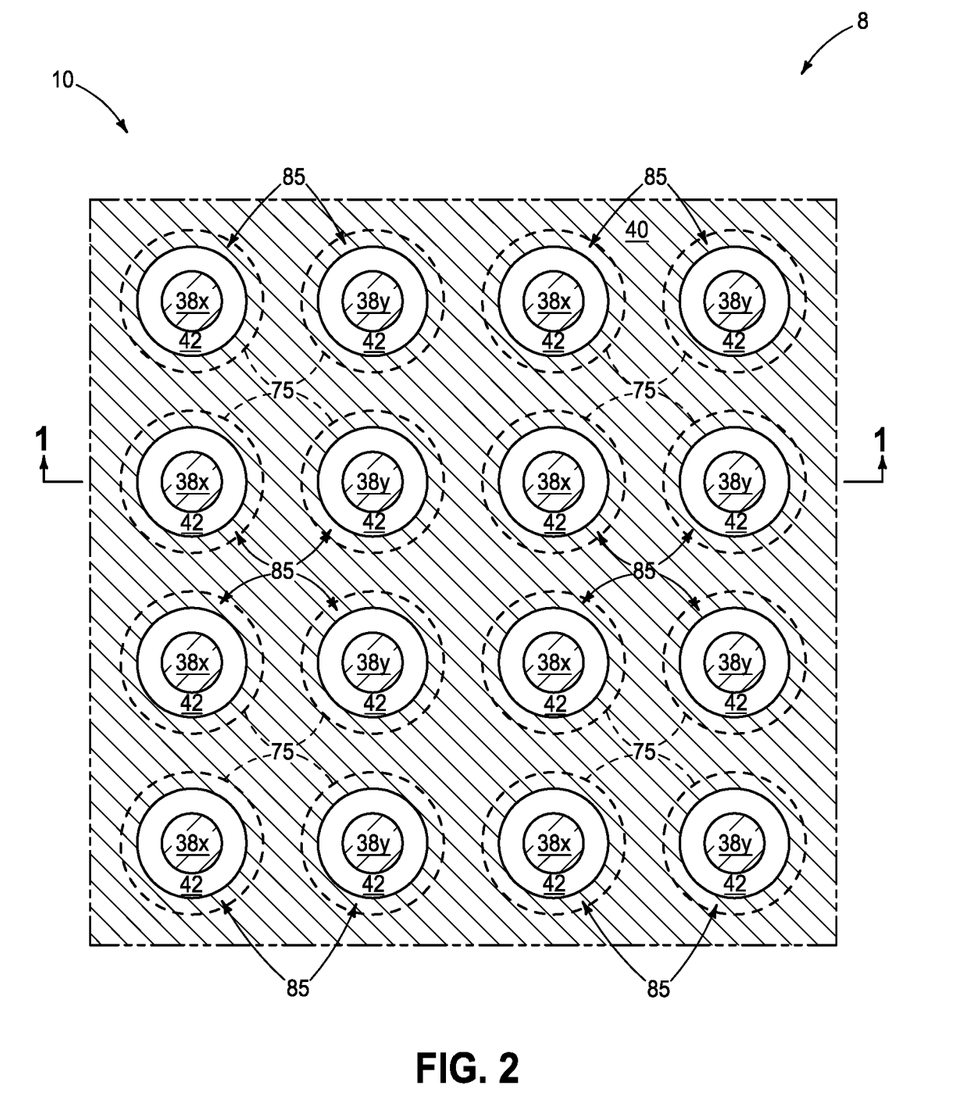
FIG. 2 is a cross-sectional view of part of the FIG. 1 construction, and is taken through line 2-2 in FIG. 1.
Figure 3:
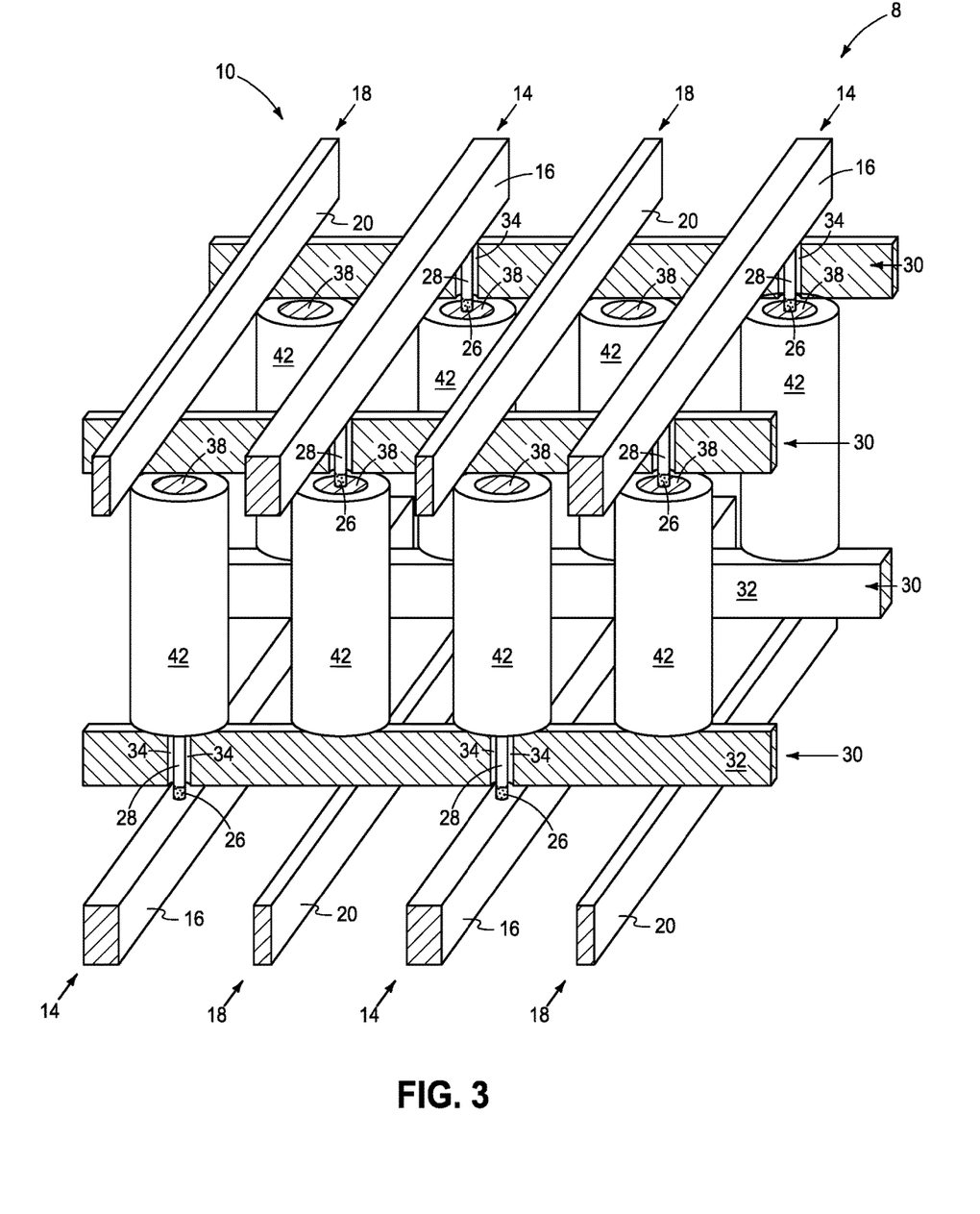
FIG. 3 is a diagrammatic perspective view of the FIGS. 1 and 2 constructions wherein certain materials have been removed for clarity.

Array 10 comprises memory cells 75 that individually comprise a capacitor 85 and a transistor 25. In one embodiment, transistors 25 are elevationally-extending transistors, and in one such embodiment are vertical or within 10° of vertical. In one embodiment, memory cells 75 individually have a total of only one transistor and a total of only one capacitor (e.g., a 1T-1C memory cell having only one transistor and only one capacitor and no other/additional operable electronic component [e.g., no other select device, etc.]). Array 10 comprises a first level 12 having therein alternating columns 14 of digitlines 16 and columns 18 of conductive shield lines 20 (e.g., which in operation shield from or at least reduce parasitic capacitance between immediately-adjacent digitlines 16 than would otherwise occur in the absence of a shield line 20). Use of "column" and "row" in this document is for convenience in distinguishing one series of lines from another series of lines. The columns may be straight and/or curved and/or parallel and/or not parallel relative one another, as may be the rows. Further, the columns and rows may intersect relative one another at 90° or at one or more other angles. Lines 16 and 20 may comprise, consist essentially of, or consist of any suitable conductive material(s), for example conductively-doped semiconductor material and/or metal material. Shield lines 20 may be narrower than digitlines 16 (e.g., by 50%), for example as shown.

FIGS. 1-3 show an example ideal embodiment where first-level columns 14 of digitlines 16 and first-level columns 18 of conductive shield lines 20 alternate every-other-one with one another such that every immediately-adjacent of first-level digitlines 16 have one of first-level conductive shield lines 20 laterally there-between and such that every immediately-adjacent of first-level conductive shield lines 20 have one of first-level digitlines 16 laterally there-between. However, in one embodiment, one of the first-level conductive shield lines is laterally between every immediately-adjacent of the first-level digitlines regardless of what may be laterally between immediately-adjacent shield lines (e.g., two or more shield lines may be laterally between every or some immediately-adjacent first-level digitlines). Yet further alternately, the columns of digitlines and the columns of conductive shield lines may alternate in other manners, for example pairs of two immediately-adjacent digitlines alternating with pairs of two immediately-adjacent conductive shield lines, or otherwise.

Array 10 has a second level 22 having therein elevationally-extending transistors 25 individually comprising an upper source/drain region 24, a lower source/drain region 26, and a channel region 28 extending elevationally therebetween. Rows 30 of second-level wordlines 32 (e.g., comprising, consisting essentially of, or consisting of conductively-doped semiconductor material and/or metal material) extend operatively adjacent individual second-level channel regions 28 of individual second-level transistors 25 of individual memory cells 75 within array 10 and interconnect second-level transistors 25 in that second-level row 30. A gate insulator 34 (e.g., comprising, consisting essentially of, or consisting of silicon dioxide, silicon nitride, and/or ferroelectric material) is between wordlines 32 and channel region 28. Each of source/drain regions 24, 26 comprises at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only part of each of source/drain region 24, 26 may have such maximum concentration of conductive-increasing dopant. Source/drain regions 24 and/or 26 may include other doped regions (not shown), for example halo regions, LDD regions, etc. Channel region 28 may be suitably doped with a conductivity-increasing dopant likely of the opposite conductivity-type of the dopant in source/drain regions 24, 26, and for example that is at a maximum concentration in the channel region of no greater than $1 \times 10^{16}$ atoms/cm$^3$. When suitable voltage is applied to wordlines 32, a conductive channel can form within channel region 28 such that current can flow between source/drain regions 24 and 26. Individual of first-level digitlines 16 are electrically coupled to, in one embodiment directly electrically coupled to, an individual lower source/drain region 26 of individual second-level transistors 25, with such digitlines interconnecting second-level transistors 25 along a second-level column.

Array 10 has a third level 36 above second level 22 having therein rows and columns of capacitors 85. In one embodiment, capacitors 85 are arrayed in a 2D Bravais lattice. In one such embodiment, the 2D Bravais lattice is not hexagonal or centered rectangular, and in one embodiment is one of square or non-centered rectangular, with a square 2D Bravais lattice being shown. However, other Bravais lattices (e.g., hexagonal or centered rectangular) and non-Bravais lattices may be used.

Capacitors 85 individually comprise a first capacitor electrode 38*x* or 38*y* (conductive material), a second capacitor electrode 40 (conductive material), and capacitor insulator 42 material (e.g., silicon dioxide, silicon nitride, and/or ferroelectric material) between, in one embodiment laterally between, the first and second capacitor electrodes. Second capacitor electrode 40 is not shown in FIG. 3 for clarity of other components. In one embodiment, each of capacitor electrodes has at least one capacitor electrode (e.g., 38*x*/38*y*) that is taller than it is wide. In one such embodiment, the one capacitor electrode (e.g., 38*x*/38*y*) is a pillar having a substantially circular periphery 39. Regardless, in one such embodiment, each of capacitors 85 has only one capacitor electrode (e.g., 38*x*/38*y*) that is taller than it is wide, with each of capacitors 85 having its other capacitor electrode (e.g., 40) being common to all of capacitors 85 in third level 36 of array 10, with such common other electrode in array 10 being wider than it is tall. In one embodiment and as shown, individual ones of the first capacitor electrodes (e.g., 38*x*) are electrically coupled to, in one embodiment directly electrically coupled to, and extend elevationally upward from individual upper source/drain regions 24 of individual second-level transistors 25.

A fourth level 46 is above third level 36 and has therein elevationally-extending transistors 25 analogous to transistors 25 described above with respect to second level 22. However, individual others of the first capacitor electrodes (e.g., 38*y*) are electrically coupled to, in one embodiment directly electrically coupled to, individual of lower source/drain regions 26 of individual fourth-level transistors 25.

A fifth level 50 is above fourth level 46 and therein has columns 14 of digitlines 16 and columns 18 of conductive shield lines 20. Individual of fifth-level digitlines 16 are electrically coupled to, in one embodiment directly electrically coupled to, an individual upper source/drain region 24 of individual fourth-level transistors 25 and interconnect fourth-level transistors 25 in a fourth-level column. The alternating relationship(s) of columns 14 and 18 in fifth level 50 may be the same as or different from, and may have any of the attributes of, the described alternatings of columns 14 and 18 in second level 22. In one ideal embodiment and as shown, fifth-level columns 14 of digitlines 16 and fifth-level columns 18 of conductive shield lines 20 alternate every-other-one with one another such that every immediately-adjacent of fifth-level digitlines 16 have one of fifth-level conductive shield lines 20 laterally there-between and such that every immediately-adjacent of fifth-level conductive shield lines 20 have one of fifth-level digitlines 16 laterally there-between. Dielectric material 35 (e.g., silicon dioxide and/or silicon nitride; FIG. 1) is shown surrounding the structures described above. In operation, conductive shield lines 20 would likely be controlled at one or more of positive voltage, negative voltage, or ground (as opposed to being allowed to "float") to reduce parasitic capacitance between immediately-adjacent digitlines 16.

Figure 4:
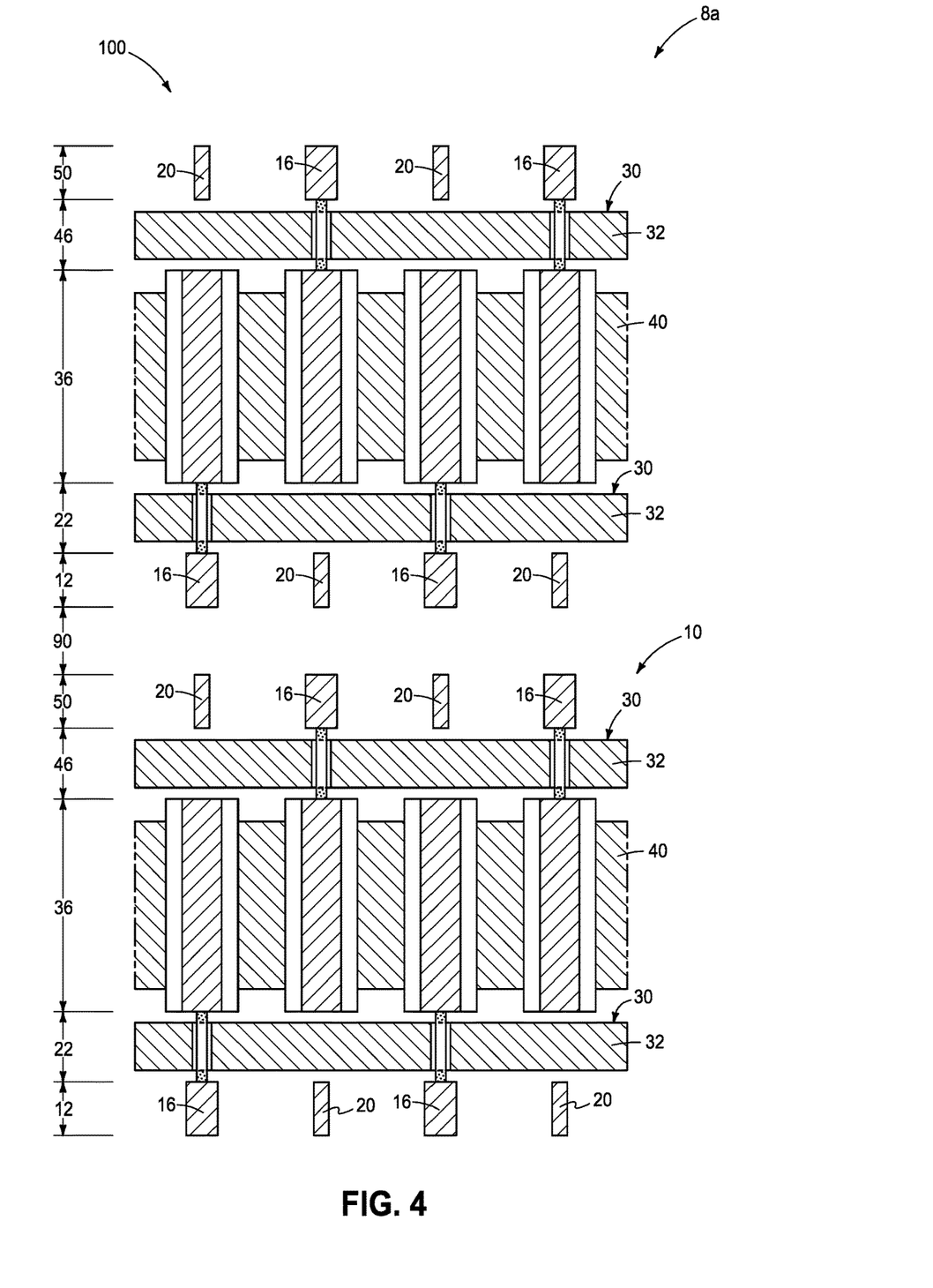
FIG. 4 is a diagrammatic cross-sectional view of a substrate construction in accordance with an embodiment of the invention.

Multiple example arrays as shown and/or described above may be stacked one atop another, including a stack comprising more than two of such arrays. For example, FIG. 4 shows an alternate example construction 8*a*. Like numerals from the first-described embodiments have been used where appropriate, with some construction differences being indicated with the suffix "a" or with different numerals. Array 10 in construction 8*a* may be considered as a first array 10. Construction 8*a* comprises another of said first array (e.g., designated with numeral 100) above first array 10. In such example embodiment, first level 12 of another first array 100 is above fifth level 50 of first array 10 (e.g., separated by an insulator level 90 [e.g., silicon dioxide and/or silicon nitride], as shown). Arrays 10 and 10*a* need not be of identical construction relative one another.

Figure 5:
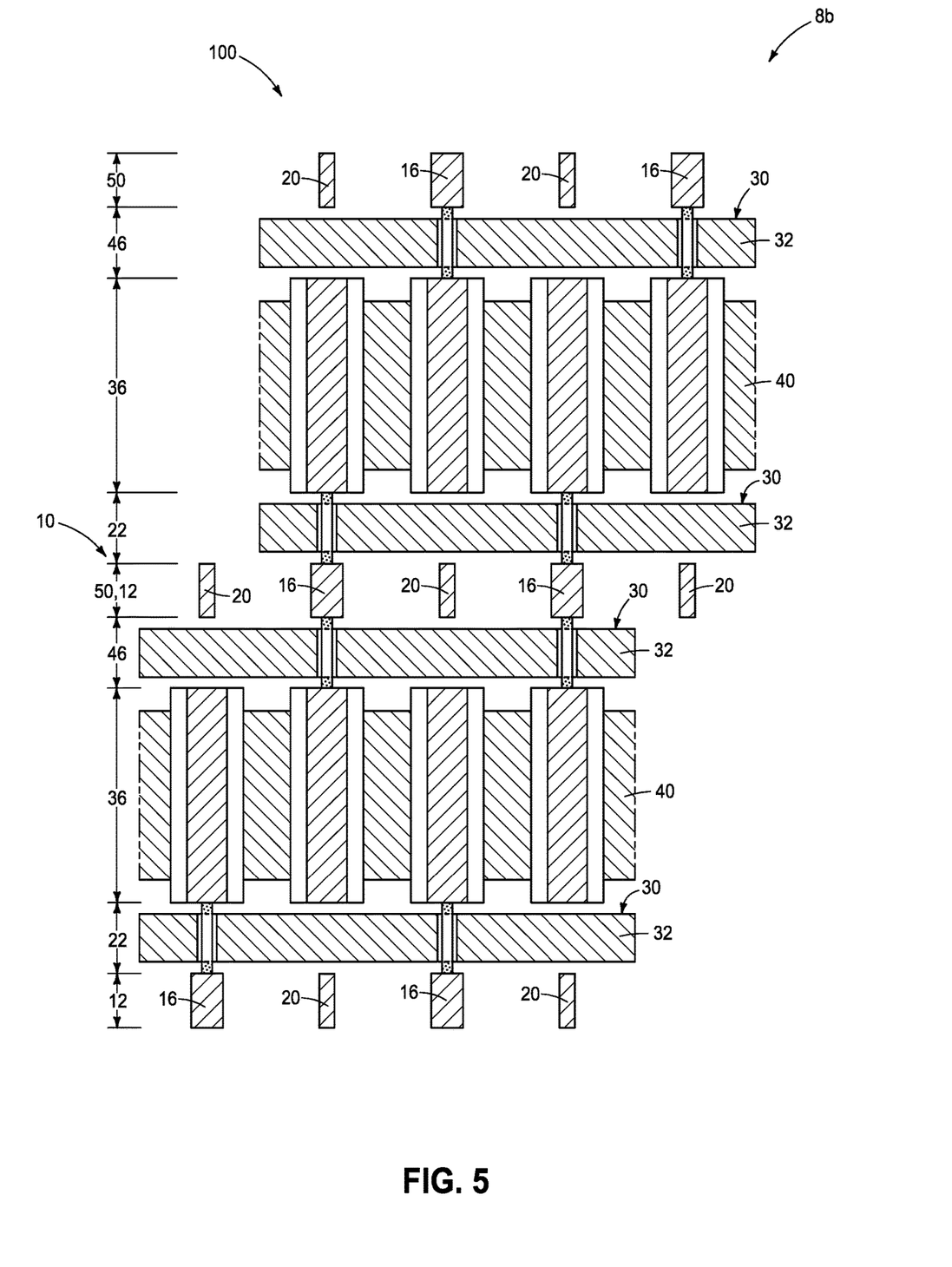
FIG. 5 is a diagrammatic cross-sectional view of a substrate construction in accordance with an embodiment of the invention.

FIG. 5 shows an alternate example embodiment construction 8*b*. Like numerals from the above-described embodiments have been used where appropriate, with some construction differences being indicated with the suffix "b". In construction 10b, fifth level 50 of first array 10 is first level 12 of another first array 100 such that alternating columns 14, 18 of digitlines 16 and conductive shield lines 20, respectively, therein are shared by first array 10 and another first array 100. Arrays 10 and 10b need not be of identical construction relative one another. Regardless, any other attribute(s) or aspect(s) as shown and/or described herein may be used in the FIGS. 4 and 5 embodiments.

Embodiments of the invention comprise an array of memory cells individually comprising a capacitor and a transistor. Such an array comprises, in a first level, alternating columns of digitlines and conductive shield lines. A second level is above the first level and therein has rows of transistor wordlines. A third level is above the second level and has therein rows and columns of capacitors. A fourth level is above the third level and has therein rows of transistor wordlines. A fifth level is above the fourth level and has therein alternating columns of digitlines and conductive shield lines. Such an array may have any of the attributes described above with respect to features 14, 16, 18, 20, 85, 30, and 32, yet also independent of any attribute described above for such features. Any other attribute(s) or aspect(s) as shown and/or described herein may be used.

Embodiments of the invention encompass methods of forming an array of memory cells individually comprising a capacitor and a transistor, wherein the array comprises, in a first level, alternating columns of digitlines and conductive shield lines. A second level is above the first level and therein has rows of transistor wordlines. A third level is above the second level and has therein rows and columns of capacitors. A fourth level is above the third level and has therein rows of transistor wordlines. A fifth level is above the fourth level and has therein alternating columns of digitlines and conductive shield lines. Such a method comprises, in at least one of the first and fifth levels, forming one of the columns of the conductive shield lines therein or the columns of the digitlines therein in a self-aligned manner using the other of the conductive shield lines therein or the columns of the digitlines therein as a template.

An example method of forming the conductive shield lines in at least one of the first and fifth levels is next described with reference to FIGS. 6-8. Like numerals from the above-described embodiments have been used for predecessor materials and constructions, with some construction differences being indicated with different numerals.

Figure 6:
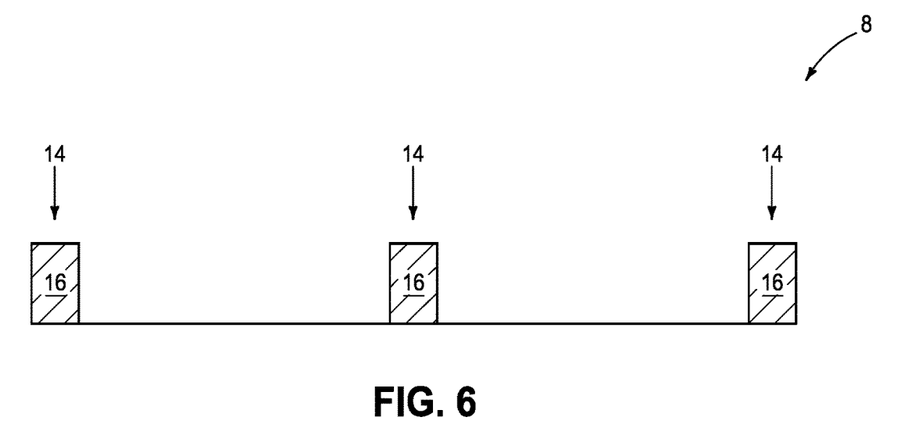
FIG. 6 is a diagrammatic cross-sectional view of a portion of a predecessor construction to that of FIG. 1 in process in accordance with an embodiment of the invention.

Referring to FIG. 6, an example portion of a predecessor construction 8 to that of FIG. 1 is shown. Columns 14 of digitlines 16 are shown as having been formed in at least one of first level 12 or fifth level 50. Accordingly, the processing of FIGS. 6-8 may be considered as occurring in only one of levels 12 and 50, or in both.

Figure 7:
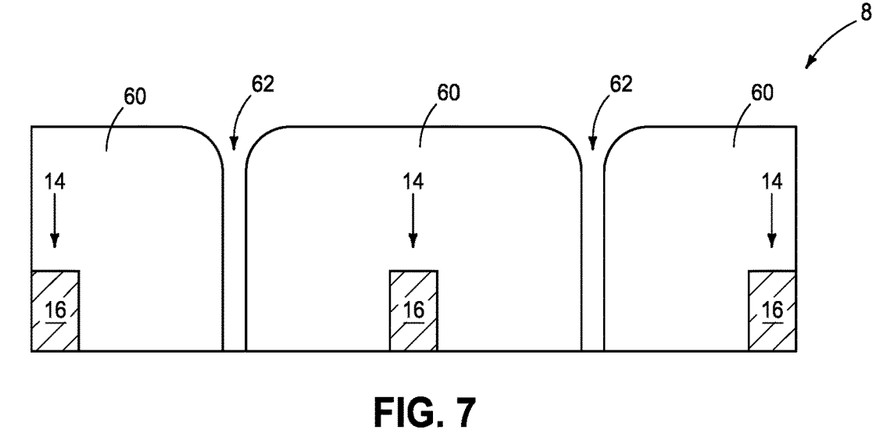
FIG. 7 is a view of the FIG. 6 construction at a processing step subsequent to that shown by FIG. 6.

Referring to FIG. 7, material 60 has been formed between immediately-adjacent of digitlines 16 to less-than-fill space that is laterally between such immediately-adjacent digitlines with such material in the one of the first and fifth levels and to leave void space 62 laterally between such immediately-adjacent digitlines in the one of the first and fifth levels. Material 60 may be dielectric and at least largely remain in a finished-circuitry-construction of the array. Alternately, material 60 may be dielectric and not largely remain in a finished-circuitry-construction of the array. Still and alternately, material 60 may be at least largely sacrificial (e.g., being any one or more conductive, dielectric, and/or semiconductive) and does not largely remain in a finished-circuitry-construction of the array. Ideally, the FIG. 7 construction is formed in a self-aligned manner, for example by conformally depositing material 60 and at the example depth depicted whereby lateral gaps (e.g., predecessor to void spaces 62) naturally form between and using digitlines 16 as a template. Thereafter, material 60 at the bases of those lateral gaps may be removed by maskless spacer-like anisotropic etching (i.e., being maskless at least within array 10) such that bases of digitlines 16 and conductive shield lines 20 may ultimately be elevationally coincident. Alternately, but less ideal, material 60 may be deposited and subsequently patterned using a mask, for example using photolithography and etch.

Figure 8:
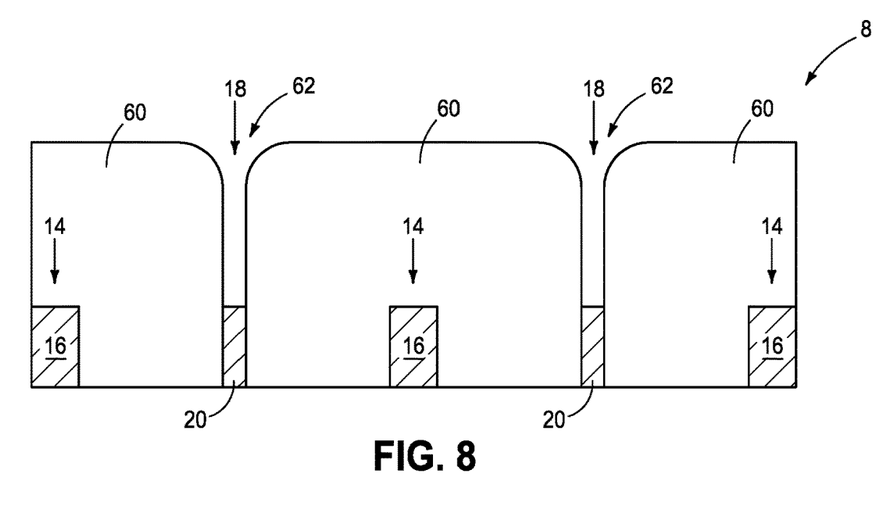
FIG. 8 is a view of the FIG. 7 construction at a processing step subsequent to that shown by FIG. 7.

Referring to FIG. 8, conductive material of conductive shield lines 20 has been formed in the void space 62 that is laterally between immediately-adjacent digitlines 16 in the depicted one of the first and fifth levels.

An example method of forming the digitlines in at least one of the first and fifth levels is next described with reference to FIGS. 9-11. Like numerals from the above-described embodiments have been used for predecessor materials and constructions.

Figure 9:
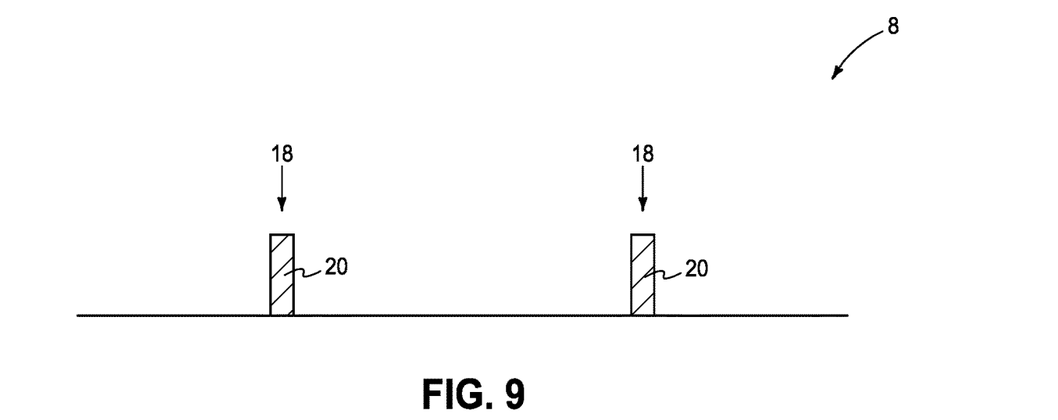
FIG. 9 is a diagrammatic cross-sectional view of a portion of a predecessor construction to that of FIG. 1 in process in accordance with an embodiment of the invention.

Referring to FIG. 9, an example portion of a predecessor construction 8 to that of FIG. 1 is shown. Columns 18 of conductive shield lines 20 are shown a having been formed in at least one of first level 12 or fifth level 50. Accordingly, the processing of FIGS. 9-10 may be considered as occurring in only one of levels 12 and 50, or in both.

Figure 10:
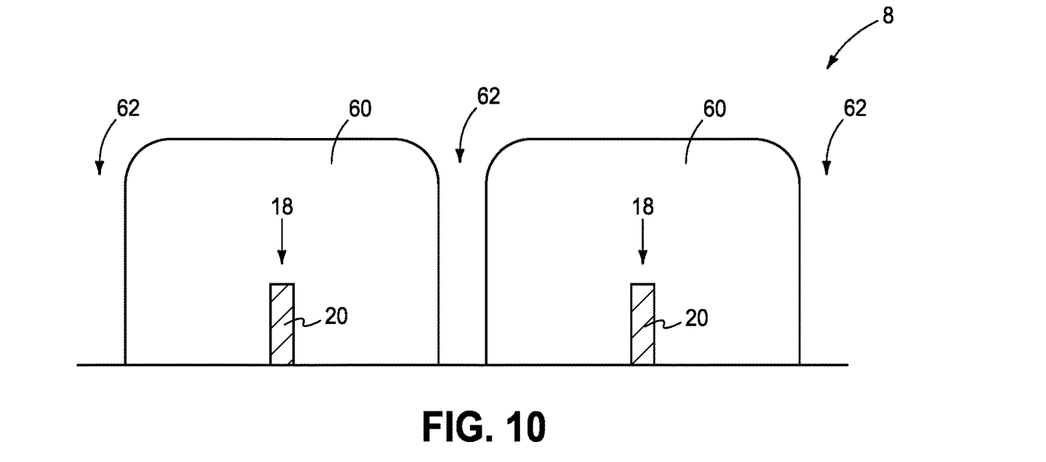
FIG. 10 is a view of the FIG. 9 construction at a processing step subsequent to that shown by FIG. 9.

Referring to FIG. 10, material 60 has been formed between immediately-adjacent of conductive shield lines 20 to less-than-fill space that is laterally between such immediately-adjacent shield lines with such material in the one of the first and fifth levels and to leave void space 62 laterally between such immediately-adjacent shield lines in the one of the first and fifth levels. Ideally, the FIG. 10 construction is formed in a self-aligned manner, for example by conformally depositing material 60 and at the example depth depicted whereby lateral gaps (e.g., predecessor to void spaces 62) naturally form between and using conductive shield lines 20 as a template. Thereafter, material 60 at the bases of those lateral gaps may be removed by maskless spacer-like anisotropic etching (i.e., being maskless at least within array 10) such that bases of digitlines 16 and conductive shield lines 20 may ultimately be elevationally coincident. Alternately, but less ideal, material 60 may be deposited and subsequently patterned using a mask, for example using photolithography and etch.

Figure 11:
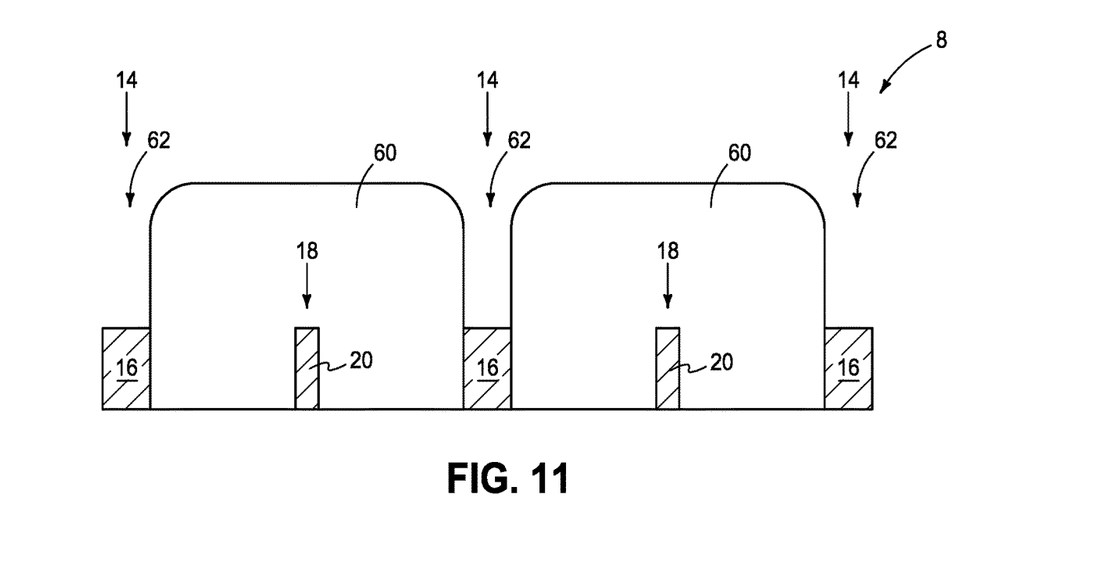
FIG. 11 is a view of the FIG. 10 construction at a processing step subsequent to that shown by FIG. 10.

Referring to FIG. 11, conductive material of digitlines 16 has been formed in the void space 62 that is laterally between immediately-adjacent shield lines 20 in the depicted one of the first and fifth levels.

Any attribute(s) or aspect(s) as shown and/or described herein with respect to structure embodiments may be used in method embodiments and vice versa. Pitch multiplication principles may be used in method aspects of the invention (e.g., features may be formed along a sidewall of another feature to have lateral thickness that is less than lateral thickness of the other feature regardless of how such other feature was formed).

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Also, "self-aligned" or "self-aligning" means a technique whereby at least one pair of opposing edges of a structure is formed by a pair of previously-defined edges, thereby not requiring subsequent photolithographic processing with respect to those opposing edges.

CONCLUSION

In some embodiments, an array of memory cells individually comprising a capacitor and a transistor comprises, in a first level, alternating columns of digitlines and conductive shield lines. In a second level above the first level there are rows of transistor wordlines. In a third level above the second level there are rows and columns of capacitors. In a fourth level above the third level there are rows of transistor wordlines. In a fifth level above the fourth level there are alternating columns of digitlines and conductive shield lines.

In some embodiments, an array of memory cells individually comprising a capacitor and a transistor comprises, in a second level above a first level, elevationally-extending transistors individually comprising an upper source/drain region, a lower source/drain region, and a channel region extending elevationally there-between. Rows of second-level wordlines extend operatively adjacent individual of the second-level channel regions of individual second-level transistors of individual memory cells within the array and interconnect the second-level transistors in that second level row. In the first level, there are alternating columns of digitlines and columns of conductive shield lines. Individual of the first-level digitlines are electrically coupled to an individual lower source/drain region of the individual second-level transistors and interconnect the second-level transistors in a second-level column. One of the first-level conductive shield lines is laterally between every immediately-adjacent of the first-level digitline. A third level is above the second level, and comprises capacitors that individually comprise a first capacitor electrode, a second capacitor electrode, and a capacitor insulator between the first and second capacitor electrodes. Individual ones of the first capacitor electrodes are electrically coupled to and extend elevationally upward from individual of the upper source/drain regions of the individual second-level transistors. In a fourth level above the third level, elevationally-extending transistors individually comprise an upper source/drain region, a lower source/drain region, and a channel region extending elevationally there-between. Rows of fourth-level wordlines extend operatively adjacent individual of the fourth-level channel regions of individual fourth-level transistors of individual memory cells within the array and interconnect the fourth-level transistors in that fourth-level row. Individual others of the first capacitor electrodes are electrically coupled to individual of the lower source/drain regions of individual fourth-level transistors. In a fifth level above the fourth level, there are columns of digitlines and columns of conductive shield lines. Individual of the fifth-level digitlines are electrically coupled to an individual upper source/drain region of the individual fourth-level transistors and interconnect the fourth-level transistors in a fourth-level column. One of the fifth-level conductive shield lines is laterally between every immediately-adjacent of the fifth-level digitlines.

Some embodiments are a method of forming an array of memory cells individually comprising a capacitor and a transistor. The array comprises, in a first level, alternating columns of digitlines and conductive shield lines. In a second level above the first level there are rows of wordlines. In a third level above the second level there are rows and columns of capacitors. In a fourth level above the third level there are rows of wordlines. In a fifth level above the fourth level there are alternating columns of digitlines and conductive shield lines. The method comprises, in at least one of the first and fifth levels, forming one of the columns of the conductive shield lines therein or the columns of the digitlines therein in a self-aligned manner using the other of the conductive shield lines therein or the columns of the digitlines therein as a template.

Some embodiments are a method of forming an array of memory cells individually comprising a capacitor and a transistor. The array comprises, in a first level, alternating columns of digitlines and conductive shield lines. In a second level above the first level there are rows of wordlines. In a third level above the second level there are rows and columns of capacitors. In a fourth level above the third level there are rows of wordlines. In a fifth level above the fourth level there are alternating columns of digitlines and conductive shield lines. The method comprises, in at least one of the first and fifth levels, forming the conductive shield lines therein sequentially comprising forming the columns of the digitlines. Material is formed between immediately-adjacent of the digitlines to less-than-fill space that is laterally between said immediately-adjacent digitlines with said material in the one of the first and fifth levels and to leave void space laterally between said immediately-adjacent digitlines in the one of the first and fifth levels. Conductive material of the conductive shield lines is formed in the void space that is laterally between said immediately-adjacent digitlines in the one of the first and fifth levels.

Some embodiments are a method of forming an array of memory cells individually comprising a capacitor and a transistor. The array comprises, in a first level, alternating columns of digitlines and conductive shield lines. In a second level above the first level there are rows of wordlines. In a third level above the second level there are rows and columns of capacitors. In a fourth level above the third level there are rows of wordlines. In a fifth level above the fourth level there are alternating columns of digitlines and conductive shield lines. The method comprises, in at least one of the first and fifth levels, forming the digitlines therein sequentially comprising forming the columns of the conductive shield lines. Material is formed between immediately-adjacent of the conductive shield lines to less-than-fill space that is laterally between said immediately-adjacent conductive shield lines with said material in the one of the first and fifth levels and to leave void space laterally between said immediately-adjacent conductive shield lines in the one of the first and fifth levels. Conductive material of the digitlines is formed in the void space that is laterally between said immediately-adjacent conductive shield lines in the one of the first and fifth levels.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of memory cells individually comprising a capacitor and a transistor, comprising:
   a first array comprising:
      in a first level, alternating columns of digitlines and conductive shield lines;
      in a second level above the first level, rows of transistor wordlines;
      in a third level above the second level, rows and columns of capacitors;
      in a fourth level above the third level, rows of transistor wordlines; and
      in a fifth level above the fourth level, alternating columns of digitlines and conductive shield lines; and
   another of said first array directly above said first array.

2. The array of claim 1 wherein the digitlines of the another of said first array are directly above the shield lines of said first array.

3. The array of claim 1 wherein the memory cells individually have a total of only one transistor and a total of only one capacitor.

4. The array of claim 1 wherein one of the first-level conductive shield lines is laterally between every immediately-adjacent of the first-level digitlines.

5. The array of claim 1 wherein the first-level columns of digitlines and the first-level columns of conductive shield lines alternate every-other-one with one another such that every immediately-adjacent of the first-level digitlines have one of the first-level conductive shield lines laterally there-between and such that every immediately-adjacent of the first-level conductive shield lines have one of the first-level digitlines laterally there-between.

6. The array of claim 1 wherein one of the fifth-level conductive shield lines is laterally between every immediately-adjacent of the fifth-level digitlines.

7. The array of claim 1 wherein the fifth-level columns of digitlines and the fifth-level columns of conductive shield lines alternate every-other-one with one another such that every immediately-adjacent of the fifth-level digitlines have one of the fifth-level conductive shield lines laterally there-between and such that every immediately-adjacent of the fifth-level conductive shield lines have one of the fifth-level digitlines laterally there-between.

8. The array of claim 1 wherein each of the transistors in the second and fourth levels are vertical or within 10° of vertical.

9. An array of memory cells individually comprising a capacitor and a transistor, comprising:
   a first array comprising:
      in a first level, alternating columns of digitlines and conductive shield lines;
      in a second level above the first level, rows of transistor wordlines;

in a third level above the second level, rows and columns of capacitors;

in a fourth level above the third level, rows of transistor wordlines;

in a fifth level above the fourth level, alternating columns of digitlines and conductive shield lines; and the memory cells individually having a total of only one transistor and a total of only one capacitor; and another of said first array directly above said first array, the first level of the another of said first array being directly above the fifth level of the first array.

10. The array of claim 9 wherein the digitlines of the another of said first array are directly above the shield lines of said first array.

11. The array of claim 9 wherein each of the transistors in the second and fourth levels are vertical or within 10° of vertical.

12. An array of memory cells individually comprising a capacitor and a transistor, comprising:

a first array comprising:
in a first level, alternating columns of digitlines and conductive shield lines;
in a second level above the first level, rows of transistor wordlines;
in a third level above the second level, rows and columns of capacitors;
in a fourth level above the third level, rows of transistor wordlines;
in a fifth level above the fourth level, alternating columns of digitlines and conductive shield lines; and
the memory cells individually having a total of only one transistor and a total of only one capacitor; and
another of said first array directly above said first array, the fifth level of the first array being the first level of the another of said first array such that the alternating columns of digitlines and conductive shield lines therein are shared by the first array and the another of said first array.

13. The array of claim 12 wherein the digitlines of the another of said first array are directly above the shield lines of said first array.

14. The array of claim 12 wherein each of the transistors in the second and fourth levels are vertical or within 10° of vertical.

15. An array of memory cells individually comprising a capacitor and a transistor, comprising:

a first array comprising:
in a first level, alternating columns of digitlines and conductive shield lines, the digitlines being elongated in a column direction;
in a second level above the first level, rows of transistor wordlines, the rows being elongated in row direction;
in a third level above the second level, rows and columns of capacitors;
in a fourth level above the third level, rows of transistor wordlines;
in a fifth level above the fourth level, alternating columns of digitlines and conductive shield lines;
the memory cells individually having a total of only one transistor and a total of only one capacitor, the transistors individually comprising a channel region, the transistor wordlines being laterally over opposing sides of individual of the channel regions in the row direction; and another of said first array directly above said first array.

16. The array of claim 15 wherein the digitlines of the another of said first array are directly above the shield lines of said first array.

17. The array of claim 15 wherein each of the transistors in the second and fourth levels are vertical or within 10° of vertical.

18. An array of memory cells individually comprising a capacitor and a transistor, comprising:

a first array comprising:
in a first level, alternating columns of digitlines and conductive shield lines, the digitlines being elongated in a column direction;
in a second level above the first level, rows of transistor wordlines, the rows being elongated in row direction;
in a third level above the second level, rows and columns of capacitors;
in a fourth level above the third level, rows of transistor wordlines;
in a fifth level above the fourth level, alternating columns of digitlines and conductive shield lines;
the memory cells individually having a total of only one transistor and a total of only one capacitor, the transistors individually comprising a channel region, the transistor wordlines being laterally over opposing sides of individual of the channel regions in the column direction; and another of said first array directly above said first array.

19. The array of claim 18 wherein the digitlines of the another of said first array are directly above the shield lines of said first array.

20. The array of claim 18 wherein each of the transistors in the second and fourth levels are vertical or within 10° of vertical.

21. An array of memory cells individually comprising a capacitor and a transistor, comprising:

a first array comprising:
in a first level, alternating columns of digitlines and conductive shield lines, the digitlines being elongated in a column direction;
in a second level above the first level, rows of transistor wordlines, the rows being elongated in row direction;
in a third level above the second level, rows and columns of capacitors;
in a fourth level above the third level, rows of transistor wordlines;
in a fifth level above the fourth level, alternating columns of digitlines and conductive shield lines;
the memory cells individually having a total of only one transistor and a total of only one capacitor, the transistors individually comprising a channel region, the transistor wordlines being laterally surrounding all sides of individual of the channel regions; and another of said first array directly above said first array.

22. The array of claim 21 wherein the digitlines of the another of said first array are directly above the shield lines of said first array.

23. The array of claim 21 wherein each of the transistors in the second and fourth levels are vertical or within 10° of vertical.

* * * * *